United States Patent
Solis et al.

(10) Patent No.: US 8,440,904 B2
(45) Date of Patent: May 14, 2013

(54) ISOBUTYLENE-BASED ELASTOMERS IN VOLTAIC CELL APPLICATIONS

(75) Inventors: Scott C. Solis, Houston, TX (US);
Adriana S. Silva, Houston, TX (US)

(73) Assignee: ExxonMobil Chemical Patents Inc., Houston, TX (US)

( * ) Notice: Subject to any disclaimer, the term of this patent is extended or adjusted under 35 U.S.C. 154(b) by 882 days.

(21) Appl. No.: 12/567,968

(22) Filed: Sep. 28, 2009

(65) Prior Publication Data

US 2011/0073164 A1  Mar. 31, 2011

(51) Int. Cl.
*H02N 6/00* (2006.01)
(52) U.S. Cl.
USPC .......................................................... 136/251
(58) Field of Classification Search .................... 136/251
See application file for complete search history.

(56) References Cited

U.S. PATENT DOCUMENTS

| | | | |
|---|---|---|---|
| 5,508,205 A | 4/1996 | Dominguez et al. | |
| 6,066,796 A | 5/2000 | Itoyama et al. | |
| 6,420,646 B2 | 7/2002 | Benz et al. | |
| 7,449,629 B2 | 11/2008 | Ferri et al. | |
| 7,638,186 B2 | 12/2009 | Hull et al. | |
| 8,158,450 B1 * | 4/2012 | Sheats et al. | 438/57 |
| 2005/0067007 A1 | 3/2005 | Toft | |
| 2008/0216889 A1 | 9/2008 | Blong et al. | |
| 2008/0245405 A1 | 10/2008 | Garvison et al. | |
| 2008/0276983 A1 | 11/2008 | Drake et al. | |
| 2009/0101204 A1 | 4/2009 | Levy et al. | |
| 2009/0133340 A1 | 5/2009 | Shiao et al. | |
| 2009/0162666 A1 | 6/2009 | Daniel | |
| 2011/0048513 A1 * | 3/2011 | Booth et al. | 136/252 |

FOREIGN PATENT DOCUMENTS

| | | |
|---|---|---|
| WO | WO 2007-002618 | 1/2007 |
| WO | WO 2007/120197 | 10/2007 |
| WO | WO 2009/114189 | 9/2009 |

* cited by examiner

*Primary Examiner* — Edward Cain
(74) *Attorney, Agent, or Firm* — Kevin M. Faulkner

(57) ABSTRACT

Disclosed in one aspect is a voltaic cell assembly comprising one or more voltaic cells, a photovoltaic cell in one embodiment; an elastomeric film and a transparent film, the voltaic cell sandwiched there between. The elastomeric film can be formed from a natural rubber or an isobutylene-based elastomer. More particularly, the elastomeric film may comprise a DVA of a polyamide and a functionalized poly(isobutylene-co-p-methylstyrene). The assembly described is useful for a number of end use articles including roofing shingles, automotive components, building components, and, in general, solar arrays.

24 Claims, 2 Drawing Sheets

ISOBUTYLENE-BASED ELASTOMERS IN VOLTAIC CELL APPLICATIONS

FIELD OF THE INVENTION

The present disclosure relates to elastomeric films useful for mounting voltaic cells in the production of solar arrays and other devices, and in particular to isobutylene-based elastomers, nanocomposites and dynamically vulcanized alloys ("DVAs") of such elastomers for use in solar arrays comprising photovoltaic cells.

BACKGROUND OF THE INVENTION

Photovoltaic solar panels, also referred to simply as solar panels, comprise photovoltaic cells and can take any number of basic designs. One design employs crystalline silicon wafers connected together and embedded in a laminating film. The laminating film and the wafers embedded therein are typically sandwiched between two layers (or panels) of glass, a polymeric material or other suitable materials.

Another photovoltaic cell design employs one of amorphous silicon, cadmium-telluride (CdTe) or copper-indium-diselenide, $CuInSe_2$ (commonly referred to as "CIS"), or a similar semiconductor material, which is deposited on a substrate in a thin film. These thin film photovoltaic materials are typically deposited in a thin film on a glass substrate by a method such as sputtering, Physical Vapor Deposition ("PVD") or Chemical Vapor Deposition ("CVD"), and the photocells are typically formed by a laser etching process. To complete the construction, an assembly adhesive is applied over the photovoltaic material, associated circuitry, and any protective layer which is present, and a backing material is applied.

The circuitry, such as a bus bar, which collects the electrical current generated by the solar panel must be connected by wiring to a suitable storage device, such as a battery. The module wire must exit the solar panel at some point. Additional adhesive or sealant material is needed to seal around the module wire exiting the solar panel. The adhesive used for sealing around module wires may be the same as, or may differ from, the assembly adhesive used to attach the backing material to the solar panel.

Solar panels are used outdoors, and so are exposed to the elements, including wind, water and sunlight. Solar panels are deleteriously affected primarily by moisture which may permeate into the panel, reaching the electrical connections or the photovoltaic materials. Water penetration into solar panels has been a long-standing problem. Thus, various attempts have been made to reduce the moisture vapor transmission rate (MVTR). Solar panels may also be deleteriously affected by wind and sunlight, which may result in failure of the adhesive layer. Wind causes obvious physical damage, and sunlight results in heating of the solar panel and exposure to ultraviolet (UV) radiation. Thus, most all voltaic cells, photovoltaic cells in particular, are assembled with at least two encapsulant layers, one below and one above the cell, to provide moisture/oxygen/electrical isolation to the cell. In photovoltaic cells, at least one of the encapsulants that covers one face of the cell should be transparent. The cell will typically be formed on, or reside upon, the other encapsulant or "back sheet", or may be formed or reside upon a so called "substrate" layer such as a metal or polyimide film that is then adjacent to the back sheet.

Many voltaic cell structures have been disclosed. Disclosures of interest include U.S. Pat. Nos. 5,508,205, 6,066,796, 6,420,646, 7,449,629, US 2008-0245405, US 2008-0276983, US 2009-0101204, US 2009-0162666 and WO 2007-002618. While there is some disclosure in the prior art of building solar panels having elastic components, there is still the practical problem of adhering all of the desired transparent and elastomeric layers together in a cost effect manner that still maintains the desired oxygen/moisture/electrical isolation for the photovoltaic cell.

Isobutylene-based elastomers are known to present extremely good barrier properties in certain applications. The inventors have found that isobutylene-based elastomers would allow for the fabrication of photovoltaic modules which are more impervious to moisture, while still being part of a flexible array. This class of materials can be formed into sheets by various methods, for example, calendering or blowing, and would be integrated into the manufacturing process of the module. Desirably, the isobutylene-based elastomers may act as both the back sheet for a cell assembly as well as an encapsulant.

SUMMARY OF THE INVENTION

Disclosed in one aspect is a voltaic cell assembly comprising one or more voltaic cells, a photovoltaic cell in one embodiment; an elastomeric film comprising an isobutylene-based elastomer and a transparent encapsulant that can be rigid such as glass, or flexible such as a poly(ethylene vinylacetate) film, the voltaic cell sandwiched there between. The elastomeric film acts as an encapsulant for the cell, or "back sheet." In some embodiments, the cell may reside directly on the elastomeric film. In other embodiments, the cell resides, or is etched/laid on a substrate layer, which then adheres to the elastomeric film.

In certain embodiments, there may also be a tie-layer sandwiched between the voltaic cells and the elastomeric film. The tie-layer may be a blend of (a) from 1 to 99 wt %, by weight of the tie-layer, of the material that comprises the transparent film; and (b) from 99 to 1 wt %, by weight of the tie-layer, of the materials that comprise the elastomeric film.

In a particular embodiment, the elastomeric film comprises a natural rubber or an isobutylene-based elastomer. In a more particular embodiment, the elastomeric film comprises a DVA of a polyamide and a functionalized poly(isobutylene-co-p-methylstyrene).

Disclosed in another aspect is a method of making a voltaic cell assembly comprising providing an elastomeric film; contacting one or more voltaic cells with the elastomeric film; applying a transparent film to the elastomeric film and voltaic cells, covering the elastomeric film with the voltaic cell there between; and curing the transparent film so that it sealingly (creating an adherence between materials that is at least oxygen and moisture isolating, preferably form fitting) isolates the voltaic cells and secures the voltaic cell to the cured elastomeric film. The elastomeric film is provided as cured in one embodiment, and is cured simultaneously with the transparent film in another embodiment.

BRIEF DESCRIPTION OF THE DRAWINGS

The figures are provided to elucidate the basic structure of the voltaic cell assemblies described herein and are not intended to be to scale.

DETAILED DESCRIPTION OF THE DRAWINGS

Figure 1:
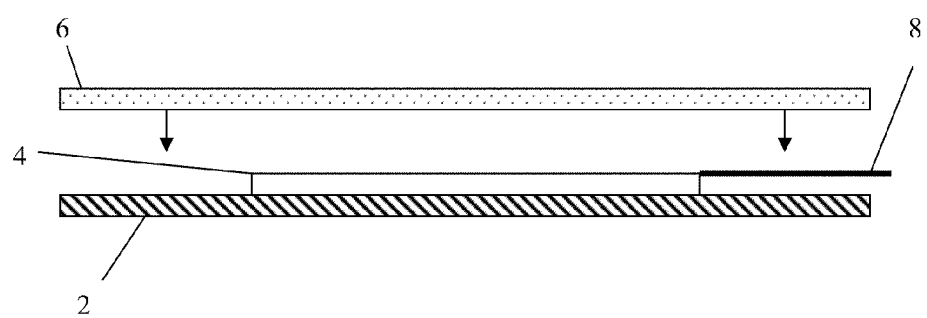
FIG. 1 is a side-view cutaway diagram of one embodiment of the voltaic assembly described herein.

This disclosure is directed to an electrically non-conductive, moisture impermeable (very low permeability) assembly for voltaic cells. Advantageously, the assembly is also oxygen impermeable. This is accomplished by encasing the voltaic cell, a photovoltaic cell in certain embodiments, in at least two layers of material, both of which will adhere to one another and are flexible with respect to one another such that the layers form a voltaic cell assembly that can be form-fitted to a variety of structures that will be exposed to the elements. At least one of these encapsulating layers is transparent, and desirably oxygen/moisture/electrical impermeable. The other encapsulating layer comprises an oxygen/moisture/electrical impermeable material such as an elastomer, and in a particular embodiment, isobutylene-based elastomer.

Thus, in one embodiment is described a voltaic cell assembly comprising one or more voltaic cells, preferably photovoltaic cells; an elastomeric film and a transparent film, the voltaic cell sandwiched there between. As used herein, a "film" is a substantially flat section of a polymeric (e.g., thermoplastic and/or elastomeric) material(s) whose thickness is very small in relation to its width and length and has a continuous or nearly continuous macroscopic morphology throughout its structure allowing for the passage of air at diffusion-limited rates or lower. The term "film" is not limited to any thickness of material and can be any desirable thickness such as within the range of from 10 μm to 10 mm. A film can comprise one or more layers of material, the same or different.

In a typical photovoltaic cell, there are at least three components: a transparent encapsulant, a back sheet (also an encapsulant), an optional substrate upon which the cell can be etched or otherwise laid upon, and the cell sandwiched there between. This is depicted in one embodiment in FIG. 1, described further below. In one embodiment of the present disclosure, an elastomeric film is the back sheet upon which the cell can be laid/etched directly, or upon which an optional substrate can be attached that comprises the cell, then having a transparent film encapsulant on the side of the cell that light will impinge. The use of an elastomeric film offers flexibility to the photovoltaic cell and the assembly to which it is a part. In the case where the cell is crystalline and not flexible, it may be desirable to use glass or some other solid, transparent material as the transparent encapsulant with the elastomeric film. In the case where the cell is flexible, such as a thin-film cell that is etched onto a surface, the transparent encapsulant can also be, for example, glass, but could also be a flexible encapsulate such as poly(ethylene vinyl acetate) ("EVA"). In this later embodiment, wherein the transparent encapsulant is flexible, it will be referred to as a "transparent film."

Substrate materials, when present, are well known in the art and can include very thin film metals such as sputtered aluminum, or polymeric materials such as Kapton™ polyimide films or Teonex™ PEN and Melinex™ ST polyester films from DuPont. When present, a substrate can be adhered to the back sheet. The substrate may also be reflective and serve to reflect incoming light to the cell surface. In the present disclosure, the flexible back sheet is referred to as the "elastomeric film." In one embodiment, the photovoltaic cell is etched/laid directly upon the elastomeric film, and in another embodiment, a substrate is adhered to the elastomeric film, the substrate comprising the cell.

The elastomeric film provides suitable structural integrity and strength to the voltaic cell assemblies described herein, while maintaining flexibility. The assembly is preferably assembled so that it can be folded, cornered or otherwise conform to most any shape or profile. In these embodiments, the voltaic cell may be a crystalline cell or thin film cell, preferably the later. The elastomer film can comprise any suitable material to achieve this, as well as keep the cells in oxygen, moisture and electrical isolation. In certain embodiments, the elastomeric film comprises (or consists essentially of) a natural rubber or an isobutylene-based elastomer. In yet another embodiment, the natural rubber or isobutylene-based elastomer is a nanocomposite (layered filler blended with elastomer and optional exfoliating agent), described further below. In yet another embodiment, the elastomeric film comprises a DVA of polyamide and a functionalized poly isobutylene-co-p-methylstyrene).

The materials used to produce the elastomeric film, transparent film and other described layers of the assembly may comprise any suitable material or blend of material as described herein. However, in certain embodiments, silane-modified polymers are substantially absent, meaning that they are not added to any of the films or layers of the voltaic cell assemblies described herein. Suitable materials are described further herein.

The voltaic cell assembly described herein can take on any desirable geometry and construction comprising any number of layers of materials as long as they provide the air and water impermeability desired, as well as electrical isolation of each cell. In certain embodiments, the assembly further comprises a "tie-layer" sandwiched between the voltaic cell and the elastomeric film. The tie-layer is preferably made of a material that facilitates the joining or adhering of the cell to the elastomeric film, as well as the adhering of the transparent film to the elastomeric film. In one embodiment, the tie-layer comprises two or more layers of the same or different polymeric materials. In a particular embodiment, the tie-layer, or at least the layer of the tie-layer that is adjacent to the elastomeric film, is a blend of the following components: (a) from 1 or 2 or 5 or 10 or 20 or 30 wt % to 50 or 60 or 70 or 80 or 90 or 99 wt %, by weight of the tie-layer, of the material that comprises the transparent film; and (b) from 99 or 90 or 80 or 70 or 60 or 50 wt % to 30 or 20 or 10 or 5 or 2 or 1 wt %, by weight of the tie-layer, of the materials that comprise the elastomeric film.

Desirably, the tie-layer can be made so that it serves more than one purpose. The tie-layer may simply be provided to adhere various layers of materials together within the cell. But in certain embodiments, the tie-layer may also act as the substrate layer upon which the cell is etched/laid.

Another embodiment of the voltaic cell assembly comprises a sealing layer that contacts the transparent film and the tie-layer at least around the edges of the voltaic cell(s). The sealing layer should comprise a material that adheres to the elastomeric film (or tie-layer) and the transparent film, as it desirably makes firm contact with both as well as the cell. The sealing layer can be used to provide further electrical isolation of each cell from adjoining cells and can be made to accommodate the wires or conductive leads going from one cell to the other, such as by fluidly forming around the lead and then hardening and/or curing in a secondary step. The sealing layer can conform to the outer edge of the cell regardless of its geometry. The sealing layer can be made from a thermoplastic, an elastomer, a blend of the two, or other adhesives known in the art such as epoxies; silanes; low weight average molecular weight (<80,000 g/mole) polyolefins, polyvinyl acetate polyamide, hydrocarbon resins, natural asphalts, styrenic rubbers, polyisoprene; urethane adhesives, and butyl-based adhesives, any of which may be hot melt-type or solvent-based adhesives. In a preferred embodiment, silanes are substantially absent, meaning they are not added to the sealing layer.

In certain embodiments, the tie-layer comprises two or more layers, and the layer of the tie-layer adjacent to the elastomeric film is a distinct tie-layer. The tie-layer is made from a material that will secure the voltaic cell to the elastomeric film and also preferably adhere to both the transparent film and sealing layer and the elastomeric film. In a particular embodiment, the tie-layer may comprise material that is suitable for the substrate layer, that is, the material upon which the cell will reside. The tie-layer in this regard will serve the purpose of providing a material upon which the cell can be etched/laid, and provide a tie-material to secure the various films to one another within the assembly.

Any one or more of the films or layers of material supporting and conforming to the voltaic cells may comprise one or more fillers, desirably a non-conductive filler. The filler may be in the form of an amorphous material, plate-like material, or crystalline material, or any other material known. The filler may in certain embodiments include agents that will exfoliate the elastomeric film as is known in the art to form a nanocomposite. In certain embodiments the filler is present within the range of from 5 or 10 or 15 wt % to 25 or 35 or 45 or 55 or 65 or 85 wt %, by weight of the elastomeric film, transparent film, tie-layer, sealing layer, or any other structure of the voltaic cell assembly.

There can be any number of layers of materials that make up the voltaic cell assemblies described herein. One embodiment of such an assembly is depicted in FIG. 1, wherein the cross-sectional view shows the elastomeric film 2 which can comprise two or more layers, having a cell 4 adhered thereto. A transparent encapsulant 6, which is a flexible film in certain embodiments, is adhered to the cell and elastomeric film to sandwich the cell there between. The transparent film 6 is sealingly formed against the cell, leads and other materials sandwiched between the elastomeric and transparent films. An electrically conductive lead 8 is shown that would carry electrical current to or from the cell. Not shown are any number of other leads that would similarly be connected to the cell. The elastomeric film 2 and transparent films 6 are desirably made of different materials, the transparent cell most preferably being transparent to at least visible light. However, desirably, the transparent and elastomeric films will be made of materials that will adhere to one another. In a particular embodiment, elastomeric film 2 comprises a tie-layer that faces the cell so that it can adhere the elastomeric film to the transparent film.

The voltaic cell assembly may comprise not only a number of elastomeric and/or transparent films. In a particular embodiment, described with reference to FIG. 2, the assembly described herein includes a tie-layer 18 adhered to the elastomeric film 10 and cell 12. At least one transparent film 14 is then placed over the cell 12 and other films or layers to sealingly attach to the cell 12 and tie-layer 18. In this embodiment, the tie-layer 18 can serve as the substrate upon which the cell resides, or is etched/laid. At least one electrical lead 16 may also be present, and accommodated by the films and/or layers by fluidly forming around the lead to keep it and the cell in moisture, oxygen and electrical isolation.

Figure 2:
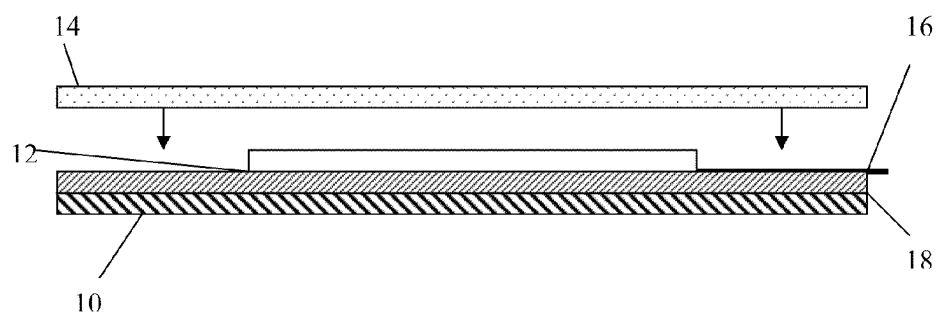
FIG. 2 is a side-view cutaway diagram of another embodiment of the voltaic assembly described herein which includes the tie-layer.
Figure 3:
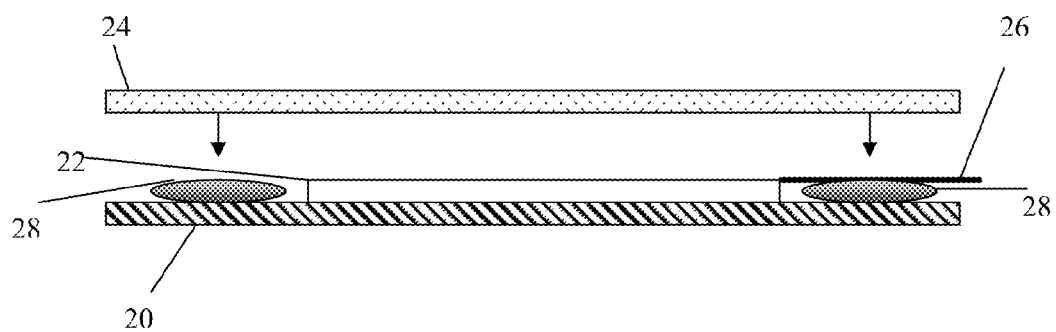
FIG. 3 is a side-view cutaway diagram of yet another embodiment of the voltaic assembly described herein which includes the sealing layers.

The voltaic cell assembly may also include some additional or different means of sealing the voltaic cells between the one or more transparent and elastomeric films. A sealing layer is shown with respect to the embodiment of FIG. 3, wherein cell 22 is sandwiched between elastomeric film 20 and transparent film 24, the sealing layer 26 being there between as a film or viscous material that may later harden when activated. The sealing layer can form around the periphery of the cell 22 and the at least one electrical lead 28. Of course, each of FIGS. 1-3 depicts only one cell, but in fact can include 10, 20, 50, 100 or more cells desirably being in electrical isolation from one another. In any case, the sealing layer(s) are present, or applied, at the edges of the voltaic cell to achieve electrical isolation. In certain embodiments, the sealing layer is the same material as the transparent film, or a blend of the material used to make the transparent film and the elastomeric film.

Figure 4:
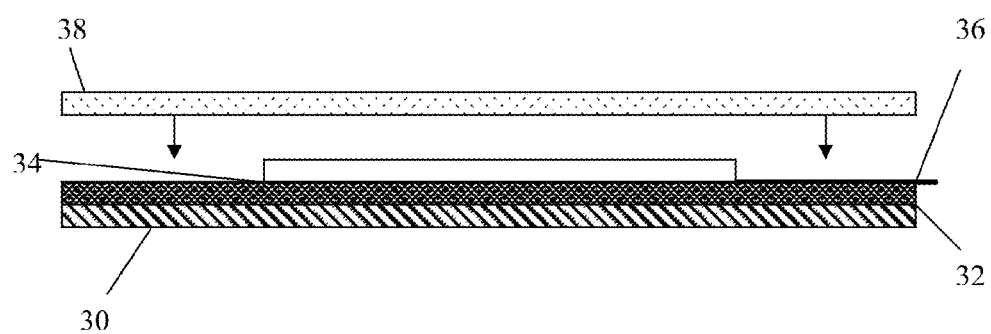
FIG. 4 is a side-view cutaway diagram of yet another embodiment of the voltaic assembly described herein which includes a substrate layer.

The cell assembly may also include a substrate layer upon which the cell may be laid/etched. The substrate layer is demonstrated with respect to FIG. 4, where an elastomeric film 30 is provided and adhered to a substrate layer 32, the cell 34 residing on and adhered to the substrate layer 32. The substrate layer 32 could, in certain embodiments, be a reflective layer, or could include a layer of a reflective material. The cell 34 also includes an electrical lead 36 which may go to other cells or ultimately to a junction box (not shown). A transparent encapsulant 38 is then provided, which can be a rigid material such as a glass or flexible such as polyvinylfluoride or EVA films.

Adhesives may be applied to adhere the various layers, but preferably, the layers adhere to one another due to the inherent nature of the materials to adhere to one another, or upon application of heat or other cure conditions to melt-weld the materials together. In certain embodiments, adhesives are substantially absent from the various layers of materials.

The voltaic cell assembly can take on any number of designs. In one embodiment, a cell comprising a first layer p-doped amorphous silica, a second layer of non-doped amorphous silica, a third layer of n-doped silica, the third layer of material adhered to a substrate such as sputtered aluminum, then an elastomeric encapsulant such as the elastomeric film described herein. In a particular embodiment, all of these layers and sandwiched between glass. The glass layer adjacent to the first silica layer may have a layer of tin or zinc oxide there between. In another particular embodiment, there may be a transparent film such as a film of EVA adjacent to the glass, sandwiched between the glass and semiconductor materials.

In another embodiment, the cell assembly comprises a first layer of tin or zinc oxide, a layer of CdS (n-layer), a third layer of CdTe (p-layer), a metal or polymeric substrate layer, then an encapsulant layer such as an elastomeric film. A tie-layer may optionally be present either above the layers of semiconductor, below the layers of semiconductor, or both. In certain embodiments, glass may sandwich all of the layers. In other embodiments, a transparent film of polymeric material may reside adjacent to the tin or zinc oxide layer to encapsulate the cell.

In yet another embodiment, the cell assembly may comprise a transparent encapsulant such as a film of EVA, adjacent to a layer of zinc oxide laid onto a thicker layer of $CuInSe_2$ or $CuGaSe_2$. The layer below that may be a layer of metal or polymer as a substrate, then the elastomeric encapsulant such as the elastomeric films described herein.

In yet another particular embodiment, the cell assembly may comprise a transparent encapsulant such as a film of EVA, adjacent to the semiconductor cell layers, which is adjacent to a substrate layer made from a material such as a polyimide, which is then adjacent to an encapsulant/back sheet layer of an isobutylene-based polymer. In certain embodiments, the cell may be adjacent to a reflective layer that is then adjacent to the back sheet of elastomer.

In yet another particular embodiment, the cell assembly may comprise a transparent encapsulant such as a film of EVA, adjacent to the semiconductor cell layers, which is adjacent to a substrate/encapsulant layer formed of an isobutylene-based polymer. In a particular embodiment, a glass layer is provided adjacent to the transparent film, and in a more particular embodiment, the assembly is sandwiched between two layers of glass.

The various layers and films may take on many forms. For example, the substrate and back sheet may be the same material such as the elastomeric film, or the elastomeric film may be provided as a back sheet but with a layer of different material such as metal or polyimide to act as a substrate for the cell. The various layers may be adhered to one another just by the inherent tendency for the materials to adhere, as the case may be, or an adhesive may be used. In yet another embodiment, a tie-layer in the initial form of a film or layer of material on a film is used to adhere the various layers together. In particular embodiments, such as to adhere the transparent film to the elastomeric film, at least one tie-layer located above and/or below the cell may be provided to facilitate adhering of the films.

The overall voltaic cell assembly can have any desirable thickness from a range of less than 1 mm to several millimeters. In certain embodiments, the elastomeric film has an average thickness of less than 1000 or 800 or 600 or 400 μm, or within the range of from 10 or 50 or 100 or 400 μm to 500 or 800 or 1000 μm or 2 or 5 mm. The elastomeric film may comprise two, three, four or more layers of material, the same or different.

As used herein, a "voltaic cell" is a device created whenever dissimilar metals, connected in some way, are immersed in a conductive fluid. In certain embodiments, the voltaic cells useful herein are photovoltaic cells. A photovoltaic cell is a device that converts light directly into electricity by the photovoltaic effect. Sometimes the term "solar cell" is reserved for devices intended specifically to capture energy from sunlight, while the term photovoltaic cell is used when the light source is unspecified. As used herein, a "photovoltaic cell" is inclusive of all meanings common in the art. Assemblies of cells are used to make solar panels, solar modules, or photovoltaic arrays.

Newer generation materials have been developed to address energy requirements and production costs of photovoltaic cells. These newer materials can be used in the photovoltaic cells described herein. Further, manufacturing techniques such as solution deposition, vapor deposition, electroplating, and use of ultrasonic nozzles can be used, as they reduce high temperatures generated during processing.

Photovoltaic cells are generally of two basic designs. One design employs crystalline silicon wafers connected together and embedded in a laminating film. The laminating film and the wafers embedded therein are typically sandwiched between two lights, or panels, of glass, a polymeric material or other suitable materials.

The second photovoltaic cell design employs one of amorphous silicon, cadmium-telluride (CdTe) or copper-indium-diselenide, $CuInSe_2$ (commonly referred to as "CIS"), or a similar semiconductor material such as mentioned below, which is deposited on a substrate in a thin film. These thin film photovoltaic materials are typically deposited in a thin film on a glass substrate by a method such as sputtering, PVD or CVD. The individual photocells are typically formed by a laser etching process, and are connected together by suitable circuitry, such as a bus bar. The bus bar transfers to a storage device the electrical current output from the photocells. The thin film photovoltaic material and associated circuitry may be covered by a sputtered layer of aluminum, which acts to protect the underlying structures. To complete the construction, an assembly adhesive and/or certain materials in the film form (cured or uncured) is applied over the photovoltaic material, associated circuitry, and any protective layer which is present, and a backing material is applied. The backing material is typically glass, but may be metal, a composite such as fiberglass, a plastic material or elastomeric material such as the material used to make the elastomeric films disclosed herein.

Some useful second generation materials include cadmium telluride (CdTe), copper indium gallium selenide, amorphous silicon and micromorphous silicon. These materials are applied in a thin film to a supporting substrate such as glass or ceramics, reducing material mass and therefore costs. These technologies do hold promise of higher conversion efficiencies, particularly CIS (copper-indium-gallium), CIGS (copper-indium-gallium-selenide) CIGS-CIS, DSC and CdTe offers significantly cheaper production costs.

In one embodiment, the photovoltaic material layer includes a layer of amorphous silicon, cadmium telluride, copper-indium-diselenide (CIS), or another Group I-III-IV semiconductor material. A number of different I-III-VI semiconductor materials have been proposed for use in photovoltaic cells. Some examples include $AgInS_2$, $AgGaSe_2$, $AgGaTe_2$, $AgInSe_2$, $AgInTe_2$, $CuGaS_2$, $CuInS_2$, $CuInTe_2$, $CuAIS_2$, and $CuGaSe_2$.

In another embodiment, the solar panel comprises crystalline silicon wafers connected together and embedded in a laminating film. The crystalline silicon may be polycrystalline or monocrystalline silicon. The current disclosure is applicable to both of these types of cells. In addition, the current disclosure is applicable to cells including other photovoltaic materials, such as gallium arsenide on germanium (GaAs/Ge), gallium arsenide on gallium arsenide (GaAs/GaAs), or gallium indium phosphide on gallium arsenide/germanium (GaInP/GaAs/Ge). The photovoltaic material layers including amorphous silicon, cadmium telluride or copper-indium-sulfide are more susceptible to intrusion of moisture than are the panels including crystalline silicon, so potentially benefit more from the current disclosure. The current disclosure is not limited to any particular type of voltaic cell. Accordingly, for exemplary but non-limiting purposes, photovoltaic material layers including amorphous silicon, cadmium telluride or copper-indium-sulfide, and in particular, amorphous silicon.

In yet another embodiment, the photovoltaic cell may be a new generation type of cell that includes multi junction stacked cells. Such cells can be made from any suitable materials such as those disclosed. Another alternative type of cell comprises conjugated organic or aromatic molecules.

The semi-conductive (or photovoltaic) material that is used to form the photovoltaic cell is formed on a front panel of material which may be, for example, ordinary borosilicate glass. In another embodiment, the front panel is low-iron glass, which allows more sunlight to pass through the glass. In addition to glass, the front panel (and an optional back panel) may also be formed of a tough plastic film, such as Tedlar™ brand of polyvinylfluoride (PVF) (E. I. du Pont De Nemours and Co.). PVF, such as Tedlar™ PVF, has a high coefficient of visible light transmission and low coefficient of infrared light transmission so that heat is not transmitted back through the front panel. The front panel should be a material which is not harmed by ultraviolet light since it will be continuously exposed to ultraviolet radiation during daylight hours. Other light transmissive, UV resistant polymers may be used, such as ethylene tetrafluoride-perfluorovinyl ether copolymers (PFA), commercially available as Neolflon™ PFA film (Daikin Industry K. K.) ethylene tetrafluoride-propylene hexafluoride copolymers (FEP) commercially available as FEP type Toyoflon™ film from Toray K.K., and ethylene tetrafluoride-ethylene copolymers (ETFE) commercially available as Tefzel™ ETFE film from E. I. du Pont. In one embodiment, the front panel is glass and the back panel is a material such as Tedlar™ PVF, or another of the polymeric materials. Other suitable materials may be used as the front panel and the back panel, as known in the art. In particular, as disclosed herein, the front panel can be or include a transparent film as described herein, and the back panel can be or include an elastomeric film as described herein.

The photovoltaic cells useful herein can be of any size and shape suitable for the end use application. Typical photovoltaic cells have a square or rectangular surface with edge length ranging from 1 or 5 or 10 to 15 or 30 cm and thickness from 0.1 or 0.2 or 0.3 or 0.5 to 2 or 3 mm. The achievable power ranges from 1.3 to 2 or 5 or 10 watts in certain embodiments.

To form a solar array or panel, photovoltaic cells are disposed side-by-side in square or rectangular arrays comprising, for example, 10×6 cells or similar numbers, with cell-to-cell spacings of, for example 1 to 3 cm. The ratio of the area of the photovoltaic cells to the total area of the photovoltaic elements ranges from 20 or 40 or 45 to 55 or 60 or 80%.

The individual cells of such arrays are connected together to form electrical units by means of conductor tracks ("leads" from one cell to another), also known as "strings". To collect the electric power or the generated current, at least one lead must be brought out of the photovoltaic element. When the elements are connected in series, it is expedient to bring out one line or cable from each of the first and last elements, respectively.

The voltaic cell assembly described herein includes at least one layer of material of any desirable thickness that will allow the transmission of at least visible light through its thickness. This layer, or "transparent film" can comprise any number of layers of material, each layer being the same or different. In certain embodiments, the transparent film comprises polymers selected from the group consisting of poly(ethylene-vinylacetate) (EVA or HEVA), poly(ethylene-n-butylacetate), polyurethanes, polyethylenes, functionalized polyethylenes, functionalized polypropylenes, acid terpolymers (e.g., ethylene-ethyl acrylate-acrylic acid terpolymer), ethylene methyl-acrylate acrylic-acid terpolymer, acid copolymers (e.g., ethylene acrylic acid, Escor™ brand), ethylene methyl acrylate (Optema™ EMA copolymers), ionomers (e.g., poly(ethylene-co-methacrylic acid)), polyvinyl-butyral, poly(ethylene-teraphthalate), polystyrene, polyacrylamide, polyvinylfluoride, cellulose resins, poly(ethylene tetrafluoroethylene), and combinations thereof. In a particular embodiment, the transparent film comprises EVA or blends of EVA with a polyolefin. A desirable EVA is ExxonMobil UL04331EL made by ExxonMobil Chemical Co.

The functionalized or "grafted" polyethylene or polypropylenes are well known in the art and include polyolefins having, for example, maleated groups or silane groups covalently bonded to the polymer backbone. Polyethylenes and polypropylenes include HDPE, LDPE, copolymers, elastomers such as propylene-based elastomers (e.g., Vistamaxx™ available from ExxonMobil Chemical Co.) and plastomers (e.g., Exact™ available from ExxonMobil Chemical Co.), and grafted versions thereof. In certain embodiments, silane-grafted polymers of any kind are substantially absent from the transparent film, meaning they are not used in the film in any layer, as an adhesive, or otherwise. In any case, these polyolefins can be produced by any known means such as by polymerization with radicals, transition metal halides and alkyls, single-site organometallic compounds and combinations thereof.

The transparent film can be applied to the assembly in any number of ways, either pre-cured or post-cured. The film can be contacted with the voltaic cell and elastomeric film as a laminate melt or solid either pre-cured or to be cured after assembly. The transparent film can have any desirable thickness, and in certain embodiments has an average thickness of less than 1000 or 800 or 600 or 400 μm. In a desirable embodiment, the transparent film is made of a material that will adhere to the elastomeric film. In a particular embodiment, the transparent film comprises at least one layer adjacent to the voltaic cell and elastomeric film that is made from a material that will adhere to the elastomeric film, as long as adequate transparency is maintained.

In a particular embodiment, the transparent film comprises two or more layers of the same or different polymeric materials. For example, the transparent film or any layer thereof may comprise a mixture of EVA and an isobutylene-based elastomer, such as from 1 to 10 or 20 wt %, by weight of the blend, of the elastomer in one embodiment. In other embodiments, the transparent film or at least one layer of transparent film is made from a material that will adhere to the sealing layer. Thus, in this embodiment, the assembly maintains structural integrity and electrical/oxygen/moisture isolation by adherence of the various films and layers to one another through the sealing layer.

In another embodiment, the transparent film may comprise EVA or similar polymer, while the elastomeric film may be a blend of an isobutylene-based polymer and a modified polypropylene or a more polar thermoplastic such as nylon. In yet another embodiment, a tie-tie-layer may be present that is made from a blend of an isobutylene-based polymer and a modified polypropylene or a more polar thermoplastic such as nylon, while the elastomeric film is the same or mostly comprising an elastomer such as an isobutylene-based elastomer. In yet another embodiment, the transparent film may be a blend of EVA and a modified polyolefin while the elastomeric film may be a blend of an isobutylene-based elastomer and a modified polyolefin.

In one embodiment, the sealing layer is made from a blend of the materials used to make the elastomeric film and the transparent film. In a particular embodiment, the sealing layer is a blend of the following components: (a) from 1 or 2 or 5 or 10 or 20 or 30 wt % to 50 or 60 or 70 or 80 or 90 or 99 wt %, by weight of the sealing layer, of the material that comprises the transparent film; and (b) from 99 or 90 or 80 or 70 or 60 or 50 wt % to 30 or 20 or 10 or 5 or 2 or 1 wt %, by weight of the sealing layer, of the materials that comprise the elastomeric film.

The transparent film may include one or more fillers as long as they do not substantially reduce transparency. Some useful fillers include wollastonite, silica, titanium dioxide, glass fiber, hollow glass spheres and some clays such as kaolin.

The "elastomeric film" is a layer of material that comprises, or consists essentially of in certain embodiments, at least one isobutylene-based elastomer. In certain embodiments, the elastomeric film comprises a blend of two or more elastomers, or an elastomer and a thermoplastic, or more particularly, an engineering resin. The elastomeric film can comprise one material, or two, three or more layers of different materials or different amounts of the same material. For example, the elastomer film can comprise a first layer of an isobutylene-based elastomer and a second layer of a blend of an isobutylene-based elastomer and a thermoplastic such as nylon or polypropylene. Further, the elastomeric film can be described as having a voltaic cell facing side, which could comprise, for example, the first layer, and a so-called substrate side which could comprise, for example, the second layer. In a particular embodiment, the elastomeric film comprises a first and second layer, wherein at least the first layer comprises a blend of an isobutylene-based elastomer and the material that comprises the transparent film or the sealing layer, if present; wherein in this example the first layer is the voltaic cell facing layer which faces and makes contact with the voltaic cell.

In a particular embodiment, the elastomeric film comprises (or consists essentially of) a natural rubber or an isobutylene-based elastomer. An "isobutylene-based" elastomer is a polymer that comprises at least 30 or 40 or 50 wt %, by weight of the polymer, of isobutylene-derived units. When referring to "isobutylene-based elastomers," this includes blends of two or more different isobutylene-based elastomers. In yet another embodiment, the elastomeric film comprises the elastomeric film comprises a functionalized poly(isobutylene-co-p-methylstyrene). In yet another particular embodiment, the elastomeric film is a dynamically vulcanized alloy of a thermoplastic such as nylon and a functionalized poly(isobutylene-co-p-methylstyrene). In yet another particular embodiment, the isobutylene-based elastomer is a nanocomposite.

In certain embodiments, the isobutylene-based elastomer is a halogenated isobutylene-based elastomer. These polymers can be described as random copolymer of a C4 to C7 isomonoolefin derived unit, such as isobutylene derived unit, and at least one other polymerizable unit. In one embodiment of this disclosure, the halogenated isobutylene-based copolymer is a butyl-type rubber or branched butyl-type rubber, especially brominated versions of these elastomers. Useful unsaturated butyl rubbers such as homopolymers and copolymers of olefins or isoolefins and other types of elastomers suitable for this disclosure are well known and are described in RUBBER TECHNOLOGY 209-581 (Maurice Morton ed., Chapman & Hall 1995).

Butyl rubbers are typically prepared by reacting a mixture of monomers, the mixture having at least (1) a isoolefin monomer component such as isobutylene with (2) a multiolefin, monomer component. The isoolefin is in a range from 70 to 99.5 wt % by weight of the total monomer mixture in one embodiment, and 85 to 99.5 wt % in another embodiment. The multiolefin component is present in the monomer mixture from 30 to 0.5 wt % in one embodiment, and from 15 to 0.5 wt % in another embodiment. In yet another embodiment, from 8 to 0.5 wt % of the monomer mixture is multiolefin. The isoolefin is preferably a C4 to C12 compound, non-limiting examples of which are compounds such as isobutylene, isobutene, 2-methyl-1-butene, 3-methyl-1-butene, 2-methyl-2-butene, 1-butene, 2-butene, methyl vinyl ether, indene, vinyltrimethylsilane, hexene, and 4-methyl-1-pentene. The multiolefin is a C4 to C14 multiolefin such as isoprene, butadiene, 2,3-dimethyl-1,3-butadiene, myrcene, 6,6-dimethyl-fulvene, hexadiene, cyclopentadiene, and piperylene, and other monomers known in the art. Other polymerizable monomers such as styrene and dichlorostyrene are also suitable for homopolymerization or copolymerization in butyl rubbers.

Halogenated butyl rubber is produced by the halogenation of the butyl rubber product described above. Halogenation can be carried out by any means, and this disclosure is not herein limited by the halogenation process. Methods of halogenating polymers such as butyl polymers are well known in the art. The halogenated butyl rubber typically has a Mooney Viscosity of 20 to 70 (ML 1+8 at 125° C.); for example, 25 to 55 in another embodiment. The halogen content is typically 0.1 to 10 wt % based on the weight of the halogenated butyl rubber; for example, 0.5 to 5 wt %; alternatively, 0.8 to 2.5 wt %; for example, 1 to 2 wt %. A commercial embodiment of a halogenated butyl rubber useful in the present disclosure is Bromobutyl 2222 (ExxonMobil Chemical Company).

Another useful embodiment of halogenated butyl rubber is halogenated, branched or "star-branched" butyl rubber. In one embodiment, the star-branched butyl rubber ("SBB") is a composition comprising butyl rubber and a polydiene or block copolymer. The polydienes, block copolymer, or branching agents (hereinafter "polydienes"), are typically cationically reactive and are present during the polymerization of the butyl or halogenated butyl rubber, or can be blended with the butyl rubber to form the SBB. The branching agent or polydiene can be any suitable branching agent, and this disclosure is not limited to the type of polydiene or branching agent used to make the SBB.

In one embodiment, the SBB is a composition of butyl or halogenated butyl rubber as described above and a copolymer of a polydiene and a partially hydrogenated polydiene selected from the group consisting of styrene, polybutadiene, polyisoprene, polypiperylene, natural rubber, styrene-butadiene rubber, ethylene-propylene diene rubber (EPDM), ethylene-propylene rubber (EPM), styrene-butadiene-styrene and styrene-isoprene-styrene block copolymers. Polydienes can be present, based on the total monomer content in wt %, typically greater than 0.3 wt %; alternatively, 0.3 to 3 wt %; or 0.4 to 2.7 wt %.

Preferably the branched or "star-branched" butyl rubber used herein is halogenated. In one embodiment, the halogenated star-branched butyl rubber ("HSBB") comprises a butyl rubber, either halogenated or not, and a polydiene or block copolymer, either halogenated or not. The present disclosure is not limited by the method of forming the HSBB. The polydiene/block copolymer, or branching agents (hereinafter "polydienes"), are typically cationically reactive and are present during the polymerization of the butyl or halogenated butyl rubber, or can be blended with the butyl or halogenated butyl rubber to form the HSBB. The branching agent or polydiene can be any suitable branching agent, and this disclosure is not limited by the type of polydiene used to make the HSBB. A commercial embodiment of HSBB useful in the present disclosure is Bromobutyl 6222 (ExxonMobil Chemical Company).

Preferred isoolefin/para-alkylstyrene copolymers include random copolymers comprising a C4 to C7 isoolefin, such as isobutylene, and a functionalized methylstyrene. The functionalized methylstyrene may be an ortho-, meta-, or para-alkyl-substituted styrene. Preferred isoolefin copolymers can include monomers selected from the group consisting of isobutylene or isobutene, 2-methyl-1-butene, 3-methyl-1-butene, 2-methyl-2-butene, 1-butene, 2-butene, methyl vinyl ether, indene, vinyltrimethylsilane, hexene, and 4-methyl-1-pentene. Preferred isoolefin copolymers may also further comprise multiolefins, preferably a C4 to C14 multiolefin such as isoprene, butadiene, 2,3-dimethyl-1,3-butadiene, myrcene, 6,6-dimethyl-fulvene, hexadiene, cyclopentadiene, and piperylene, and other monomers known in the art. Desirable styrenic monomers in the isoolefin copolymer include styrene, methylstyrene, chlorostyrene, methoxystyrene, indene and indene derivatives, and combinations thereof.

In a particular embodiment, the isobutylene-based polymer is a copolymer with methylstyrene and includes monomer units randomly spaced along the polymer chain as shown:

wherein R and $R^1$ are independently hydrogen, lower alkyl, such as a $C_1$ to $C_7$ alkyl and primary or secondary alkyl halides and X is a functional group such as halogen. In a particular embodiment, R and $R^1$ are hydrogens. In certain embodiments, the amount of functionalized structure (2) is from 0.1 or 0.4 to 1 or 5 mol %.

The functional group X may be halogen or some other functional group which may be incorporated by nucleophilic substitution of benzylic halogen with other groups such as carboxylic acids; carboxy salts; carboxy esters, amides and imides; hydroxy; alkoxide; phenoxide; thiolate; thioether; xanthate; cyanide; cyanate; amino and mixtures thereof, thus forming functionalized poly(isobutylene-co-p-methylstyrene). In another embodiment, the functionality is selected such that it can react or form polar bonds with functional groups present in the matrix polymer of a desirable composition, for example, acid, amino or hydroxyl functional groups, when the polymer components are mixed at high temperatures. In a particular embodiment, the elastomer is halogenated poly(isobutylene-co-p-methylstyrene), and in a more particular embodiment, is brominated poly(isobutylene-co-p-methylstyrene) ("BIMS").

Preferred halogenated poly(isobutylene-co-p-methylstyrene) polymers are brominated polymers which generally contain from 0.1 to 5 wt % of bromomethyl groups. In yet another embodiment, the amount of bromomethyl groups is 0.2 to 2.5 wt %. Expressed another way, preferred copolymers contain 0.05 to 2.5 mole % of bromine, based on the weight of the polymer, more preferably 0.1 to 1.25 mole % bromine, and are substantially free of ring halogen or halogen in the polymer backbone chain.

The elastomeric film may comprise other materials Non-limiting examples of other elastomers that can be blended include nylon-elastomer dynamically vulcanized alloys, polypropylene-elastomer dynamically vulcanized alloys, natural rubber, polyisoprene rubber, poly(styrene-co-butadiene) rubber (SBR), polybutadiene rubber (BR), poly(isoprene-co-butadiene) rubber (IBR), styrene-isoprene-butadiene rubber (SIBR), ethylene-propylene rubber (EPM), ethylene-propylene-diene rubber (EPDM), polysulfide, nitrile rubber, propylene oxide polymers, star-branched butyl rubber and halogenated star-branched butyl rubber, brominated butyl rubber, chlorinated butyl rubber, star-branched polyisobutylene rubber, star-branched brominated butyl (polyisobutylene/isoprene copolymer) rubber; poly(isobutylene-co-p-methylstyrene), halogenated poly(isobutylene-co-p-methylstyrene), and blends thereof.

Other materials that may be useful as the in a blend with the material(s) of the elastomeric film, sealing layer and/or tie-layer, or alone as one or more layers of the voltaic cell assembly are selected from polyacrylic acid (PAA), cross-linked polyethylene (PEX or XLPE), polyethylene (PE), polyethylene terephthalate (PET or PETE), polyphenyl ether (PPE), polyvinyl chloride (PVC), polyvinylidene chloride (PVDC), polylactic acid (PLA), polypropylene (PP), polybutylene (PB), polybutylene terephthalate (PBT), polyamide (PA), polyimide (PI), polycarbonate (PC), polytetrafluoroethylene (PTFE), polystyrene (PS), polyurethane (PU), polyester (PEs), acrylonitrile butadiene styrene (ABS), polymethyl methacrylate (PMMA), polyoxymethylene (POM), polysulfone (PES), styrene-acrylonitrile (SAN), ethylene vinyl acetate (EVA), styrene maleic anhydride (SMA), polycaprolactone, and mixtures thereof. As used throughout, polyethylene and polypropylene include homopolymers and copolymers thereof, such as, for example, LLDPEs, HDPEs, plastomers (ethylene-based elastomers) and propylene-based elastomers; these polymers can be made by any suitable means such as by Ziegler-Natta catalysis, metallocene catalysis, or chromium catalysis.

In particular, the elastomeric film may also comprise so called high diene elastomers. High diene content rubber or elastomer, also referred to as high diene monomer rubber, is a rubber comprising typically at least 50 mole % of a C4 to C12 diene monomer, typically at least 60 mole % to 100 mole %; more preferably at least 70 mole % to 100 mole %; more preferably at least 80 mole % to 100 mole %. Useful high diene monomer rubbers include homopolymers and copolymers of olefins or isoolefins and multiolefins, or homopolymers of multiolefins. These are well known in the art. Preferred examples of high diene monomer rubbers include polyisoprene, polybutadiene rubber, styrene-butadiene rubber, natural rubber, chloroprene rubber, acrylonitrile-butadiene rubber and the like, which may be used alone or in combination and mixtures.

Another useful group of high diene monomers rubbers includes styrenic block copolymers such as those having styrene contents of 5 wt % to 95 wt %, preferably 10 wt % to 85 wt %, more preferably 15 wt % to 70 wt %. Preferred styrenic block copolymers (SBC's) include those that generally comprise a thermoplastic block portion A and an elastomeric block portion B. The block portion A are the hard blocks and are derived from materials which have a sufficiently high glass transition temperature to form crystalline or glassy domains at the use temperature of the polymer. The hard block portion A may also be a copolymer derived from styrenic monomers such as those described above and olefinic monomers such as ethylene, propylene, butene, isoprene, butadiene, and mixtures thereof. Useful such polymers typically include less than 50% glassy phase such that the glass transition of the polymer, Tg, should be less than −50° C. In one embodiment, the hard block portion A is polystyrene, having a number average molecular weight between from 1,000 to 200,000, preferably from 2,000 to 100,000, more preferably from 5,000 to 60,000. Typically the hard block portion A comprises from 5% to 80%, preferably from 10% to 70%, more preferably from 10% to 50% of the total weight of the copolymer.

The material forming the B-block preferably has a sufficiently low glass transition temperature at the use temperature of the polymer such that crystalline or glassy domains are not formed at these working temperatures. The B-block is thus typically regarded as a soft block. The soft block portion B is typically an olefinic polymer derived from conjugated aliphatic diene monomers of from 4 to 6 carbon atoms or linear alkene monomers of from 2 to 6 carbon atoms. Suitable diene monomers include butadiene, isoprene, and the like, whereas suitable alkene monomers include ethylene, propylene, butene, and the like, in each instance, mixtures are also suitable. The soft block portion B preferably comprises a substantially amorphous polyolefin such as ethylene/propylene polymers, ethylene/butene polymers, polyisoprene, polybutadiene, and the like or mixtures thereof. The number-average molecular weight of the soft block B is typically from 1,000 to 300,000, preferably from 10,000 to 200,000, and more preferably from 20,000 to 100,000.

Exemplary suitable SBC's for use in for inclusion in the polymeric compositions described herein are styrene-olefin-styrene triblock copolymers such as styrene-butadiene-styrene (S-B-S), styrene-ethylene/butylene-styrene (S-EB-S), styrene-ethylene/propylene-styrene (S-EP-S), styrene-isoprene-styrene (S-I-S), and mixtures thereof. The SBC may be a selected SBC or a blend of SBC's. In any case, exemplary SBC's for use in the elastomeric films described herein are commercially available from Dexco Polymers LP under the designations Vector™ and from Kraton Polymers in Houston, Tex. under the designation Kraton™.

Generally, elastomeric compositions are crosslinked in the finished product. Crosslinking or vulcanization is accomplished by incorporation of curing agents and/or accelerators; the overall mixture of such agents being typically referred to as a cure "system." It is known that the physical properties, performance characteristics, and durability of vulcanized rubber compounds are directly related to the number (crosslink density) and types of crosslinks formed during the vulcanization reaction. Curing agents include those components described above that facilitate or influence the cure of elastomers, and generally include metals, accelerators, sulfur, peroxides, and other agents common in the art, and as described above.

Crosslinking or curing agents include at least one of, for example, sulfur, zinc oxide, and fatty acids and mixtures thereof. Peroxide-containing cure systems may also be used. Generally, polymer compositions maybe crosslinked by adding curative agents, for example sulfur, metal oxides (i.e., zinc oxide, ZnO), organometallic compounds, radical initiators, etc. and heating the composition or mixture. When the method known as "dynamic vulcanization" is used, the process is modified so as to substantially simultaneously mix and vulcanize, or crosslink, at least one of the vulcanizable components in a composition comprising at least one vulcanizable rubber, elastomer or polymer and at least one elastomer or polymer not vulcanizable using the vulcanizing agent(s) for the at least one vulcanizable component.

In particular, the following are common curatives that can function in dynamic vulcanization or more traditional vulcanization (heat application) in the present disclosure: ZnO, CaO, MgO, $Al_2O_3$, $CrO_3$, FeO, $Fe_2O_3$, and NiO. Other curatives may also be present with the elastomeric film including agents such as Permalux, the di-ortho-tolylguanidine salt of dicatechol borate; HVA-2, m-phenylene bis maleimide; Zisnet™, 2,4,6-trimercapto-5-triazine; ZDEDC, zinc diethyl dithiocarbamate and also including for the purposes of the present disclosure, other dithiocarbamates; Tetrone™ A (di-pentamethylene thiuram hexasulfide); Vultac™ 5 (alkylated phenol disulfides), phenol formaldehyde resin, brominated alkyl phenol formaldehyde resin; DPPD, diphenyl phenylene diamine; salicylic acid, ortho-hydroxy benzoic acid; wood rosin, abietic acid; and TMTDS, tetramethyl thiuram disulfide, used in combination with sulfur. Accelerators may also be present as part of the curative and include amines, guanidines, thioureas, thiazoles, thiurams, sulfenamides, sulfenimides, thiocarbamates, xanthates, and the like. Specific accelerators include stearic acid, diphenyl guanidine (DPG), tetramethylthiuram disulfide (TMTD), 4,4'-dithiodimorpholine (DTDM), tetrabutylthiuram disulfide (TBTD), 2,2'-benzothiazyl disulfide (MBTS), hexamethylene-1,6-bisthiosulfate disodium salt dihydrate, 2-(morpholinothio) benzothiazole (MBS or MOR), compositions of 90% MOR and 10% MBTS (MOR 90), N-tertiarybutyl-2-benzothiazole sulfanamide (TBBS), and N-oxydiethylene thiocarbamyl-N-oxydiethylene sulfonamide (OTOS), zinc 2-ethyl hexanoate (ZEH), N,N'-diethyl thiourea. Curatives, accelerators and cure systems useful with one or more crosslinkable polymers are well-known in the art. In one embodiment of this disclosure, at least one curing agent is typically present at 0.1 phr to 15 phr; alternatively at 0.5 phr to 10 phr.

The composition described herein may have one or more filler components such as calcium carbonate, clay, mica, silica and silicates, talc, titanium dioxide, starch and other organic fillers such as wood flour, and carbon black. The filler may also include other reinforcing or non-reinforcing materials such as silica, clay, calcium carbonate, talc, titanium dioxide and the like. The filler is normally present in the elastomeric film at a level of from 20 to 50 wt % by weight of the total composition, more preferably from 25 to 40 wt % by weight. Embodiments of carbon black useful in the elastomeric layer described herein include N550, N650, N660, N762, N990, and Regal™ 85 (Cabot Corporation, Alpharetta, Ga.) and the like are similarly particularly useful herein.

In a particular embodiment, the filler that is present is a non-electrically conductive filler. Non-limiting examples of such fillers include boron-nitrides, metal carbonates, coated graphite, borides, carbides, silicides, quartz, clays, micas, asbestos, glass, and combinations thereof. In certain embodiments, the non-conductive filler is present in a blend with other fillers such as carbon black.

Exfoliated, intercalated, or dispersed clays may also be present in the composition as a filler. These clays, also referred to as "nanoclays", are well known, and their identity, methods of preparation and blending with polymers is well known in the art and some are in fact commercially available from, for example, Southern Clay Products, Inc. in Gonzalas, Tex. Swellable layered clay materials suitable for the purposes of the present disclosure include natural or synthetic phyllosilicates, particularly smectic clays such as montmorillonite, nontronite, beidellite, volkonskoite, laponite, hectorite, saponite, sauconite, magadite, kenyaite, stevensite and the like, as well as vermiculite, halloysite, aluminate oxides, hydrotalcite and the like. The blend of an exfoliated clay and elastomer may be referred to as a "nanocomposite."

Layered clay may be intercalated and exfoliated by treatment with organic molecules (swelling agents) capable of undergoing ion exchange reactions with the cations present at the interlayer surfaces of the layered silicate. Suitable swelling agents include cationic surfactants such as ammonium, alkylamines or alkylammonium (primary, secondary, tertiary and quaternary), phosphonium or sulfonium derivatives of aliphatic, aromatic or arylaliphatic amines, phosphines and sulfides. Desirable amine compounds (or the corresponding ammonium ion) are those with the structure $R^1R^2R^3N$, wherein $R^1$, $R^2$, and $R^3$ are C1 to C30 alkyls or alkenes which may be the same or different. In one embodiment, the exfoliating agent is a so-called long chain tertiary amine, wherein at least R1 is a C12 to C20 alkyl or alkene.

Another class of swelling agents include those which can be covalently bonded to the interlayer surfaces. These include polysilanes having the same or different substituents and are selected from alkyl, alkoxy or oxysilane, and at least one substituent is an organic radical compatible with the matrix polymer of the composite. Other suitable swelling agents include protonated amino acids and salts thereof containing 2-30 carbon atoms such as 12-aminododecanoic acid, epsilon-caprolactam and like materials.

In a preferred embodiment of this disclosure, the exfoliating or swelling agent is combined with a halogenated polymer. In one embodiment, the agent includes all primary, secondary and tertiary amines and phosphines; alkyl and aryl sulfides and thiols; and their polyfunctional versions. Desirable additives include: long-chain tertiary amines such as N,N-dimethyl-octadecylamine, N,N-dioctadecyl-methylamine, dihydrogenated tallowalkyl-methylamine and the like, and amine-terminated polytetrahydrofuran; long-chain thiol and thiosulfate compounds such as hexamethylene sodium thiosulfate. In another embodiment of this disclosure, improved interpolymer impermeability is achieved by the use of polyfunctional curatives such as hexamethylene bis(sodium thiosulfate) and hexamethylene bis(cinnamaldehyde).

The amount of exfoliated, intercalated, or dispersed clay incorporated in the composition in accordance with this disclosure is an amount sufficient to develop an improvement in the mechanical properties or barrier properties of the composition, e.g. tensile strength or air/oxygen permeability. Amounts typically can be from 0.5 wt % to 15 wt % in one embodiment, or 1 wt % to 10 wt % in another embodiment, and 1 wt % to 5 wt % in yet another embodiment, based on the polymer content of the composition. Expressed in parts per hundred rubber, the exfoliated, intercalated, or dispersed clay may be present at 1 phr to 30 phr in one embodiment, and 3 phr to 20 phr in another embodiment. In one embodiment, the exfoliating clay is an alkylamine-exfoliated clay.

As used herein, the term "process oil" means both the petroleum derived process oils, synthetic plasticizers and reactive plasticizers. A process or plasticizer oil may be present in air barrier compositions, but the amount of such materials is limited because they tend to detract from the fluid permeation prevention properties of the composition. The oils or plasticizers are primarily used to improve the processing of the composition during preparation of the layer, for example, mixing, calendaring, etc. Generally suitable plasticizer oils include aliphatic acid esters or hydrocarbon plasticizer oils such as paraffinic or naphthenic petroleum oils. In addition, plasticizers such as organic esters and other synthetic plasticizers can be used. A particularly preferred plasticizer for use in a DVA composition is N-butylsulfanamide or other plasticizers suitable for polyamides. In another embodiment, rubber process oils such as naphthenic, aromatic or paraffinic extender oils may be present at 1 phr to 5 phr. Alternatively, the dynamically vulcanized compositions useful herein can include a reactive softener or plasticizer. Such materials are typically based on maleated ethylene ethyl acrylate (EEA); maleated ethylene oxide (EO) and maleated ethylene propylene (EP) copolymers (such as Exxelor™ brand from ExxonMobil Chemical Company); ethylene acrylic ester terpolymers based on methyl-, ethyl-or butyl-acrylate and the third monomer, either maleic anhydride or glycidyl methacrylate (Lotader brand from Arkema, Inc.); and other epoxidized polymers are also useful, such as epoxidized natural rubber and epoxidized styrene-butadiene-styrene (SBS) terpolymers. In still another embodiment, naphthenic, aliphatic, paraffinic and other aromatic oils are substantially absent from the composition. By "substantially absent", it is meant that naphthenic, aliphatic, paraffinic and other aromatic oils may be present, if at all, to an extent no greater than 2 phr in the composition.

The term "dynamic vulcanization" is one method by which a thermoplastic (or "engineering resin") and the rubber are cured, the process including mixing the components under conditions of high shear and elevated temperature in the presence of a curing agent. As a result, the rubber is simultaneously crosslinked and dispersed as fine particles, for example, in the form of a microgel, within the engineering resin which forms a continuous matrix; the resulting composition is known in the art as a "dynamically vulcanized alloy" or DVA. Dynamic vulcanization is effected by mixing the ingredients at a temperature which is at or above the curing temperature of the rubber using in the equipment such as roll mills, Banbury™ mixers, continuous mixers, kneaders, or mixing extruders (such as twin screw extruders). The unique characteristic of the dynamically cured composition is that, notwithstanding the fact that the rubber is cured, the composition can be processed and reprocessed by conventional thermoplastic processing techniques such as extrusion, injection molding, compression molding, etc. Scrap and or flashing can also be salvaged and reprocessed.

The dynamic vulcanization process is conducted at conditions to vulcanize at least partially, preferably fully, the elastomeric halogen-containing copolymer. To accomplish this, the thermoplastic engineering resin, the elastomeric copolymer and optional other polymers, are mixed together at a temperature sufficient to soften the resin or, more commonly, at a temperature above its melting point when the resin is crystalline. Preferably the cure system is premixed in the elastomer component. Heating and masticating at vulcanization temperatures are generally adequate to complete vulcanization in 0.5 to 10 minutes. The vulcanization time can be reduced by elevating the temperature of vulcanization. A suitable range of vulcanization temperatures is typically from the melting point of the resin to 300° C.; for example, the temperature may range from the melting point of the matrix resin to 275° C. Preferably the vulcanization is carried out at a temperature range from 10° C. to 50° C. above the melting temperature of the matrix resin.

It is preferred that the mixing process be continued until the desired level of vulcanization or crosslinking is completed. If vulcanization is permitted to continue after mixing has stopped, the composition may not be reprocessable as a thermoplastic. However, dynamic vulcanization can be carried out in stages. For example, vulcanization can be commenced in a twin screw extruder and pellets formed of the DVA material or material using an underwater pelletizer, thereby quenching the vulcanization before it is completed. The vulcanization process can be completed at a later time under dynamic vulcanization conditions. Those skilled in the art will appreciate the appropriate quantities, types of curatives and extent of mixing time required to carry out the vulcanization of the rubber. Where necessary or desirable to establish the appropriate concentrations and conditions, the rubber alone can be vulcanized using varying amounts of curative, which may include one or more curatives and/or accelerators, to determine the optimum cure system to be utilized and the appropriate cure conditions to achieve a substantially full cure.

While it is preferred that all components be present in the mixture prior to carrying out the dynamic vulcanization process, this is not a necessary condition. For example, in one embodiment, the elastomer to be cured can be dynamically vulcanized in the presence of a portion or all of the thermoplastic engineering resin. This blend can then be let down, or dispersed under suitable conditions into additional thermoplastic engineering resin. Similarly, it is not necessary to add all of the fillers and oil, when used, prior to the dynamic vulcanization stage. A portion or all of the fillers and oil can be added after the vulcanization is completed. Certain ingredients, such as stabilizers and process aids function more effectively if they are added after curing.

In certain embodiments, the elastomeric film comprises isobutylene-based elastomers that are not cured when first used to manufacture the voltaic cell assembly, but are then cured after assembly by suitable means such as by heating or application of other types of radiation.

In certain embodiments, the elastomeric film comprises (or consists essentially of) at least one DVA of an elastomer, especially an isobutylene-based elastomer, and an engineering resin. For purposes of the present disclosure, an engineering resin is defined to be any thermoplastic polymer, copolymer or mixture thereof having a Young's modulus of more than 500 MPa and, preferably, an air permeation coefficient of less than $60\times10^{12}$ cc·cm/cm²·sec·cm Hg (at 30° C.), including, but not limited to, one or more of the following: a) polyamide resins: nylon 6 (N6), nylon 66 (N66), nylon 46 (N46), nylon 11 (N11), nylon 12 (N12), nylon 610 (N610), nylon 612 (N612), nylon 6/66 copolymer (N6/66), nylon 6/66/610 (N6/66/610), nylon MXD6 (MXD6), nylon 6T (N6T), nylon 6/6T copolymer, nylon 66/PP copolymer, nylon 66/PPS copolymer; b) polyester resins: polybutylene terephthalate (PBT), polyethylene terephthalate (PET), polyethylene isophthalate (PEI), PET/PEI copolymer, polyacrylate (PAR), polybutylene naphthalate (PBN), liquid crystal polyester, polyoxalkylene diimide diacid/polybutyrate terephthalate copolymer and other aromatic polyesters; c) polynitrile resins: polyacrylonitrile (PAN), polymethacrylonitrile, acrylonitrile-styrene copolymers (AS), methacrylonitrile-styrene copolymers, methacrylonitrile-styrene-butadiene copolymers; d) polymethacrylate resins: polymethyl methacrylate, polyethylacrylate; e) polyvinyl resins (for illustration, not limitation): vinyl acetate (EVA or HEVA), polyvinyl alcohol (PVA), vinyl alcohol/ethylene copolymer (EVOA), polyvinylidene chloride (PVDC), polyvinyl chloride (PVC), polyvinyl/polyvinylidene copolymer, polyvinylidene chloride/methacrylate copolymer; f) cellulose resins: cellulose acetate, cellulose acetate butyrate; g) fluorine resins: polyvinylidene fluoride (PVDF), polyvinyl fluoride (PVF), polychlorofluoroethylene (PCTFE), tetrafluoroethylene/ethylene copolymer (ETFE); h) polyimide resins: aromatic polyimides); i) polysulfones; j) polyacetals; k) polyactones; l) polyphenylene oxide and polyphenylene sulfide; m) styrene-maleic anhydride; n) aromatic polyketones; and o) mixtures of any and all of a) through n) inclusive as well as mixtures of any of the illustrative or exemplified engineering resins within each of a) through n) inclusive. Polyamide resins are particularly desirable.

In any case, the film of elastomer can be made by any suitable means such as by calendaring, blowing, casting, tentering or other means, and can be subjected to treatments to roughen the surface or otherwise change the characteristics of the surface. The elastomeric film can be a laminate of two or more layers of different materials or different proportions of similar materials. For example, the elastomeric film can comprise one layer that is a "tie-layer" as described above. In particular, this tie-layer would be useful as the layer adjacent to the cell (or, if present, the substrate layer). Thus, the elastomeric film could be provided that includes a tie-layer, or it could be laminated thereon at an early stage in the manufacture of the assembly.

The voltaic cell assembly can comprise any number of cells joined together through electrical leads as is known in the art. The array itself can be of any geometry, and is desirably ordered so that the assembly can be folded and/or bent to either roll for transport, or conform to curved surfaces for use. A method of making a voltaic cell assembly comprising providing an elastomeric film, contacting one or more voltaic cells with the elastomeric film, applying a transparent film to the elastomeric film and voltaic cell, covering the elastomeric film with the voltaic cell there between; and curing the transparent film so that it sealingly isolates the voltaic cell and secures the voltaic cell to the cured elastomeric film. The "curing" in this stage can be effectuated by any suitable means such as by simply heating, microwaving, or exposure to some other activation means; as used here, "curing" can also refer to simply heating so that the films and layers fluidly conform to each other, and in particular, the cells and leads.

In a particular embodiment, the elastomeric film is provided as cured. In this case, the elastomeric film is simply provided for placement of the cells (or other layers), followed by placement of other layers such as the transparent film, then curing the transparent film, sealing layer, or both. In this embodiment, the voltaic cell may be laid, etched or otherwise adhered to the elastomeric film, or optionally, adhered to a substrate which may then be adhered to the elastomeric film. Thus, for example, the elastomeric film may be supplied in a roll, either pre-cut or cut in line while cells are adhered (laid, etched, placed in pre-fabricated form, etc.) on the elastomeric film or substrate. A tie-layer or adhesive may be used to adhere the cells to the elastomeric film. In certain embodiments, adhesives are substantially absent. In any case, next the cells and elastomeric film may travel by conveyor or other means while a roll of transparent film is applied. Alternatively, a sealing layer is applied first as a solid, cut to allow the cells to show, or a liquid or gel that will conform to the shape of the cells. Then the transparent film is placed over the length and width of the elastomeric film to cover and encapsulate the cells.

In another embodiment, the elastomeric film is cured simultaneously with the transparent film. In this embodiment, the assembly may be assembled by any suitable means, such as described above, while "curing" will also effectuate the curing of the elastomeric film. It will not be practical to dynamically vulcanize the elastomeric film when it is assembled with cells, etc, so such a film is preferably pre-cured, at least partially. EVA and other materials may be cured/crosslinked via peroxide in a vacuum laminator under heat and pressure. Some transparent films used to encapsulate do not need vulcanization such as ionomers. In the embodiments where such materials are used, the curing step can be avoided.

The formation of voltaic cell assemblies, and ultimately, solar panels, can be easier and more efficient using the methods here, as there is a possibility of removing certain undesirable steps such as the application of adhesives between layers of material and films. In certain embodiments, the transparent and elastomeric, and optional tie-layers and sealing layers can all be formulated such that they will adhere to one another without the need for applying adhesives. The application of heat to the constructed layers/films could, in certain embodiments, be all that is necessary to form the voltaic cell assembly. The disclosure herein also allows combining the functions of a back sheet and an encapsulant into one elastomeric film. This eliminates the need for two separate layers of material as is commonly provided in current photovoltaic cells.

The final voltaic cell assembly can be used for any desirable end use article. Examples of such articles include a solar array, and more particularly, the article selected from the group consisting of roofing shingles, automotive components, building components, and solar panels.

Having described the various features of the voltaic cell assembly, described herein in numbered embodiments is:

1. A voltaic cell assembly comprising:
   one or more voltaic cells;
   an elastomeric film comprising an isobutylene-based elastomer and a transparent encapsulant, the voltaic cell sandwiched there between.
2. The assembly of embodiment 1, wherein the voltaic cell is a photovoltaic cell.
3. The assembly of numbered embodiments 1 and 2, wherein silane-modified polymers are substantially absent.
4. The assembly of any one of the preceding numbered embodiments, wherein the transparent encapsulant is a transparent film comprising polymers selected from the group consisting of poly(ethylene-vinylacetate), poly(ethylene-n-butylacetate), polyurethanes, polyethylenes, functionalized polyethylenes, functionalized polypropylenes, acid terpolymers (e.g., ethylene-ethyl acrylate-acrylic acid terpolymer), ethylene methyl-acrylate acrylic-acid terpolymer, acid copolymers, ethylene methyl acrylate, ionomers (e.g., poly(ethylene-co-methacrylic acid)), polyvinylbutyral, poly(ethylene-teraphthalate), polystyrene, cellulose resins, polyacrylamide, polyvinylfluoride, poly (ethylene tetrafluoroethylene), and combinations thereof 5. The assembly of any one of the preceding numbered embodiments, further comprising a tie-layer sandwiched between the voltaic cells and the elastomeric film.

6. The assembly of numbered embodiment 5, wherein the tie-layer comprises two or more layers of the same or different polymeric materials.

7. The assembly of numbered embodiment 5, wherein the tie-layer comprises polymers selected from the group consisting of poly(ethylene-vinylacetate), poly(ethylene-n-butylacetate), polyurethanes, polyethylenes, functionalized polyethylenes, functionalized polypropylenes, acid terpolymers (e.g., ethylene-ethyl acrylate-acrylic acid terpolymer), ethylene methyl-acrylate acrylic-acid terpolymer, acid copolymers, ethylene methyl acrylate, ionomers (e.g., poly(ethylene-co-methacrylic acid)), polyvinylbutyral, poly(ethylene-teraphthalate), polystyrene, polyacrylamide, polyvinylfluoride, poly(ethylene tetrafluoroethylene), and combinations thereof 8. The assembly of numbered embodiment 5, wherein the tie-layer is a blend of the following components:
    (a) from 1 to 99 wt %, by weight of the tie-layer, of the material that comprises the transparent film; and
    (b) from 99 to 1 wt %, by weight of the tie-layer, of the materials that comprise the elastomeric film.

9. The assembly of numbered embodiment 5, wherein a sealing layer contacts the transparent film and the tie-layer at least around the voltaic cell.

10. The assembly of numbered embodiment 5, wherein the tie-layer also comprises a non-conductive filler.

11. The assembly of numbered embodiment 10, wherein the filler is present within the range of from 5 or 10 or 15 wt % to 25 or 35 or 45 or 55 or 65 or 85 wt %, by weight of the elastomeric film.

12. The assembly of numbered embodiment 10, wherein the filler is selected from boron-nitrides, metal carbonates, titanium oxide, coated graphite, borides, carbides, silicides, quartz, clays, micas, asbestos, glass, and combinations thereof 13. The assembly of numbered embodiment 5, wherein at least the layer of the tie-layer that is adjacent to the elastomeric film is a blend of the following components:
    (a) from 1 to 99 wt %, by weight of the layer, of the materials that comprise the transparent film; and
    (b) from 99 to 1 wt %, by weight of the layer, of the materials that comprise the elastomeric film.

14. The assembly of any one of the preceding numbered embodiments, wherein the voltaic cells are crystalline.

15. The assembly of any one of the preceding numbered embodiments, wherein the voltaic cells are flexible, thin film voltaic cells.

16. The assembly of any one of the preceding numbered embodiments, wherein each of the one or more cells is in electrical isolation from one another.

17. The assembly of any one of the preceding numbered embodiments, wherein a sealing layer is applied at the edges of each of the voltaic cells to achieve electrical isolation.

18. The assembly of numbered embodiment 17, wherein the sealing layer is the same material as the transparent film.

19. The assembly of numbered embodiment 17, wherein the sealing layer is a blend of the material that makes up the transparent film and the elastomeric film or layer of material adjacent to the voltaic cell.

20. The assembly of numbered embodiment 17, wherein the sealing layer is continuous with and surrounding adjacent voltaic cells.

21. The assembly of any one of the preceding numbered embodiments, wherein the elastomeric film also comprises polymers selected from the group consisting of nylon-elastomer dynamically vulcanized alloys, polypropylene-elastomer dynamically vulcanized alloys, natural rubber, polyisoprene rubber, poly(styrene-co-butadiene) rubber (SBR), polybutadiene rubber (BR), poly(isoprene-co-butadiene) rubber (IBR), styrene-isoprene-butadiene rubber (SIBR), ethylene-propylene rubber (EPM), ethylene-propylene-diene rubber (EPDM), polysulfide, nitrile rubber, propylene oxide polymers, star-branched butyl rubber and halogenated star-branched butyl rubber, brominated butyl rubber, chlorinated butyl rubber, star-branched polyisobutylene rubber, star-branched brominated butyl (polyisobutylene/isoprene copolymer) rubber; poly(isobutylene-co-p-methylstyrene), halogenated poly(isobutylene-co-p-methylstyrene), and blends thereof 22. The assembly of numbered embodiment 21, wherein the elastomeric film also comprises a non-conductive filler.

23. The assembly of numbered embodiment 22, wherein the filler is present within the range of from 5 or 10 or 15 wt % to 25 or 35 or 45 or 55 or 65 or 85 wt %, by weight of the elastomeric film.

24. The assembly of numbered embodiment 22, wherein the filler is selected from boron-nitrides, metal carbonates, coated graphite, borides, carbides, silicides, quartz, clays, micas, asbestos, glass, and combinations thereof.

25. The assembly of any one of the preceding numbered embodiments, wherein the elastomeric film comprises (or consists essentially of) a natural rubber or an isobutylene-based elastomer.

26. The assembly of numbered embodiment 25, further comprising a substrate layer adjacent to and sandwiched between the voltaic cell and the elastomeric film. The substrate layer may comprise or consist of a reflective layer.

27. The assembly of any one of the preceding numbered embodiments, wherein the elastomeric film comprises (or consists essentially of) a DVA of a polyamide and a functionalized poly(isobutylene-co-p-methylstyrene) or a nanocomposite of a layered filler and a functionalized poly(isobutylene-co-p-methylstyrene). The nanocomposite can comprise additional filler, preferably non-conducting filler.

28. The assembly of any one of the preceding numbered embodiments, wherein the elastomeric film has an average thickness of 1000 or 800 or 600 or 400 µm or less.

29. The assembly of any one of the preceding numbered embodiments, wherein the transparent film comprises two or more layers of the same or different polymeric materials.

30. The assembly of any one of the preceding numbered embodiments, wherein adhesives between the films are substantially absent.

31. The assembly of any one of the preceding numbered embodiments, further comprising a substrate layer between the cell and the elastomeric film.

32. The assembly of any numbered embodiment 31, wherein the cell is formed on the substrate layer.

33. The assembly of numbered embodiments 1-30, wherein the cell is formed on the elastomeric film.

34. A method of making a voltaic cell assembly of any one of the preceding numbered embodiments comprising:
providing an elastomeric film comprising an isobutylene-based elastomer;
laying, etching or otherwise adhering ("adhering") one or more voltaic cells on/to the elastomeric film, or optionally laying or etching or otherwise adhering one or more voltaic cells on/to a substrate, the substrate then adhered to the elastomeric film;
applying a transparent encapsulant to the elastomeric film and voltaic cells, covering the elastomeric film with the voltaic cell there between; and
curing the layers so that they sealingly isolates the voltaic cells and secure the voltaic cells to the cured elastomeric film, producing the voltaic cell assembly.

35. The method of any one of the preceding numbered embodiments 34, wherein the elastomeric film is provided as cured.

36. The method of any one of the preceding numbered embodiments 34, wherein the elastomeric film is cured simultaneously with the transparent film.

We claim:

1. A voltaic cell assembly comprising:
one or more voltaic cells;
an elastomeric film comprising an isobutylene-based elastomer and a transparent encapsulant, the voltaic cell sandwiched therebetween; and
a tie-layer sandwiched between the voltaic cells and the elastomeric film.

2. The assembly of claim 1, wherein the voltaic cell is a photovoltaic cell.

3. The assembly of claim 1, wherein silane-modified polymers are substantially absent.

4. The assembly of claim 1, wherein the transparent encapsulant is a transparent film comprising polymers selected from the group consisting of poly(ethylene-vinylacetate), poly(ethylene-n-butylacetate), polyurethanes, polyethylenes, functionalized polyethylenes, functionalized polypropylenes, acid terpolymers, ethylene methyl-acrylate acrylic-acid terpolymer, acid copolymers, ethylene methyl acrylate, ionomers, polyvinylbutyral, poly(ethylene-teraphthalate), polystyrene, cellulose resins, polyacrylamide, polyvinylfluoride, poly(ethylene tetrafluoroethylene), and combinations thereof.

5. The assembly of claim 1, wherein the tie-layer is a blend of the following components:
(a) from 1 to 99 wt %, by weight of the tie-layer, of the material that comprises the transparent film; and
(b) from 99 to 1 wt %, by weight of the tie-layer, of the materials that comprise the elastomeric film.

6. The assembly of claim 1, wherein a sealing layer contacts the transparent film and the tie-layer at least around the one or more voltaic cells.

7. The assembly of claim 1, wherein the voltaic cell is a crystalline voltaic cell.

8. The assembly of claim 1, wherein the voltaic cell is a flexible, thin film voltaic cell.

9. The assembly of claim 1, wherein a sealing layer is applied at the edges of the voltaic cell to achieve electrical isolation.

10. The assembly of claim 9, wherein the sealing layer is the same material as the transparent film.

11. The assembly of claim 9, wherein the sealing layer is a blend of the material that makes up the transparent film and the elastomeric film or layer of material adjacent to the voltaic cell.

12. The assembly of claim 9, wherein the sealing layer is continuous with and surrounding adjacent voltaic cells.

13. The assembly of claim 1, wherein the elastomeric film also comprises polymers selected from the group consisting of nylon-elastomer dynamically vulcanized alloys, polypropylene-elastomer dynamically vulcanized alloys, natural rubber, polyisoprene rubber, poly(styrene-co-butadiene) rubber, polybutadiene rubber, poly(isoprene-co-butadiene) rubber, styrene-isoprene-butadiene rubber, ethylene-propylene rubber, ethylene-propylene-diene rubber, polysulfide, nitrile rubber, propylene oxide polymers, star-branched butyl rubber and halogenated star-branched butyl rubber, brominated butyl rubber, chlorinated butyl rubber, star-branched polyisobutylene rubber, star-branched brominated butyl (polyisobutylene/isoprene copolymer) rubber;
poly(isobutylene-co-p-methylstyrene), halogenated poly(isobutylene-co-p-methylstyrene), and blends thereof.

14. A voltaic cell assembly comprising:
one or more voltaic cells and an elastomeric film comprising an isobutylene-based elastomer and a transparent encapsulant, the voltaic cell sandwiched therebetween, wherein the elastomeric film also comprises a non-conductive filler.

15. The assembly of claim 14, wherein the filler is present within the range of from 5 wt % to 85 wt %, by weight of the elastomeric film.

16. The assembly of claim 1, further comprising a substrate layer adjacent to and sandwiched between the voltaic cell and the elastomeric film.

17. The assembly of claim 1, wherein the elastomeric film comprises a DVA of a polyamide and a functionalized poly(isobutylene-co-p-methylstyrene) or a nanocomposite of a layered filler and a functionalized poly(isobutylene-co-p-methylstyrene).

18. A method of making a voltaic cell assembly comprising:
providing an elastomeric film and one or more voltaic cells;
sandwiching a tie-layer between the voltaic cells and the elastomeric film;
applying a transparent encapsulant to the elastomeric film and voltaic cells, covering the elastomeric film with the voltaic cell there between; and
curing the layers so that they sealingly isolate the voltaic cells and secure the voltaic cells to the cured elastomeric film to form the assembly.

19. The method of claim 18, wherein the elastomeric film is provided as cured.

20. The method of claim 18, wherein silane-modified polymers are substantially absent.

21. The method of claim 18, wherein the transparent encapsulant is a transparent film comprising polymers selected from the group consisting of poly(ethylene-vinylacetate), poly(ethylene-n-butylacetate), polyurethanes, polyethylenes, functionalized polyethylenes, functionalized polypropylenes, acid terpolymers, ionomers, polyvinylbutyral, poly(ethylene-teraphthalate), polystyrene, cellulose resins, polyacrylamide, polyvinylfluoride, poly(ethylene tetrafluoroethylene), and combinations thereof.

22. The method of claim 18, wherein the elastomeric film is cured simultaneously with the transparent film.

23. The method of claim 18, wherein the elastomeric film also comprises polymers selected from the group consisting of nylon-elastomer dynamically vulcanized alloys, polypropylene-elastomer dynamically vulcanized alloys, natural rubber, polyisoprene rubber, poly(styrene-co-butadiene) rubber, polybutadiene rubber, poly(isoprene-co-butadiene) rubber, styrene-isoprene-butadiene rubber, ethylene-propylene rubber, ethylene-propylene-diene rubber, polysulfide, nitrile rubber, propylene oxide polymers, star-branched butyl rubber and halogenated star-branched butyl rubber, brominated butyl rubber, chlorinated butyl rubber, star-branched polyisobutylene rubber, star-branched brominated butyl (polyisobutylene/isoprene copolymer) rubber;

poly(isobutylene-co-p-methylstyrene), halogenated poly(isobutylene-co-p-methylstyrene), and blends thereof.

24. The assembly of claim 14, wherein the elastomeric film also comprises polymers selected from the group consisting of nylon-elastomer dynamically vulcanized alloys, polypropylene-elastomer dynamically vulcanized alloys, natural rubber, polyisoprene rubber, poly(styrene-co-butadiene) rubber, polybutadiene rubber, poly(isoprene-co-butadiene) rubber, styrene-isoprene-butadiene rubber, ethylene-propylene rubber, ethylene-propylene-diene rubber, polysulfide, nitrile rubber, propylene oxide polymers, star-branched butyl rubber and halogenated star-branched butyl rubber, brominated butyl rubber, chlorinated butyl rubber, star-branched polyisobutylene rubber, star-branched brominated butyl (polyisobutylene/isoprene copolymer) rubber;

poly(isobutylene-co-p-methylstyrene), halogenated poly(isobutylene-co-p-methylstyrene), and blends thereof.

\* \* \* \* \*